(12) United States Patent
Choi

(10) Patent No.: US 9,006,817 B2
(45) Date of Patent: Apr. 14, 2015

(54) SEMICONDUCTOR DEVICE

(71) Applicant: SK Hynix Inc., Gyeonggi-do (KR)

(72) Inventor: Sang-Moo Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/148,362

(22) Filed: Jan. 6, 2014

(65) Prior Publication Data

US 2015/0048435 A1    Feb. 19, 2015

(30) Foreign Application Priority Data

Aug. 14, 2013 (KR) .................. 10-2013-0096441

(51) Int. Cl.
*H01L 29/792* (2006.01)
*H01L 27/115* (2006.01)

(52) U.S. Cl.
CPC .................. *H01L 27/115* (2013.01)

(58) Field of Classification Search
CPC ............ H01L 27/115; H01L 29/66833; H01L 29/513; H01L 21/28282; H01L 29/66666; H01L 29/66825
USPC .................................... 257/314–328
See application file for complete search history.

(56) References Cited

U.S. PATENT DOCUMENTS

| 8,169,826 B2 * | 5/2012 | Hishida et al. ........... 365/185.11 |
| 8,507,976 B2 * | 8/2013 | Joo .............................. 257/326 |
| 2010/0327340 A1 * | 12/2010 | Oota et al. .................... 257/324 |
| 2012/0273867 A1 * | 11/2012 | Ko et al. ...................... 257/324 |

* cited by examiner

*Primary Examiner* — Thanh T Nguyen
(74) *Attorney, Agent, or Firm* — IP & T Group LLP

(57) ABSTRACT

A semiconductor device comprising four semiconductor pillars extending in a direction perpendicular to a substrate, a connection channel formed on the substrate and connected to one ends of the four semiconductor pillars, a source line connected to the other ends of first and second semiconductor pillars adjacent to each other among the four semiconductor pillars, a bit line connected to the other ends of third and fourth semiconductor pillars among the four semiconductor pillars, first to fourth stack structures, which are formed along the first to fourth semiconductor pillars, respectively, between the source and bit lines and the substrate, and each includes a pass word line, at least one word line and a select line which are stacked over the substrate, and a memory layer interposed between the word line and each of the first to fourth semiconductor pillars.

18 Claims, 5 Drawing Sheets

US 9,006,817 B2

SEMICONDUCTOR DEVICE

CROSS-REFERENCE TO RELATED APPLICATIONS

The present application claims priority of Korean Patent Application No. 10-2013-0096441, filed on Aug. 14, 2013, which is incorporated herein by reference in its entirety.

BACKGROUND

1. Field

Exemplary embodiments of the present invention relate to a semiconductor device, and more particularly to a semiconductor device including a plurality of memory cells stacked on a substrate.

2. Description of the Related Art

Semiconductor devices such as, NAND-type flash memories, have been developed which may store data and retain the stored data even when the power supply is turned off.

As an increase in the integration density of two-dimensional semiconductor devices including a single memory cell layer formed on a silicon substrate reached a limit, various designs of three-dimensional semiconductor devices including a plurality of memory cells stacked vertically from (i.e., on) a silicon substrate have been proposed.

SUMMARY

Exemplary embodiments of the present invention are directed to a semiconductor device that may ensure the uniformity of memory cells and may be fabricated in a small size by a simple process.

In an exemplary embodiment of the present invention, a semiconductor device includes four semiconductor pillars extending in a direction perpendicular to a substrate, a connection channel formed on the substrate and connected to one ends of the four semiconductor pillars, a source line connected to the other ends of first and second semiconductor pillars adjacent to each other among the four semiconductor pillars, a bit line connected to the other ends of third and fourth semiconductor pillars among the four semiconductor pillars, first to fourth stack structures, which are formed along the first to fourth semiconductor pillars, respectively, between the source and bit lines and the substrate and each includes a pass word line, at least one word line and a select line which are stacked over the substrate, a memory layer interposed between the word line and each of the first to fourth semiconductor pillars, and a gate insulating layer interposed between the pass word line and each of the first to fourth semiconductor pillars and between the select line and each of the first to fourth semiconductor pillars.

In an exemplary embodiment of the present invention, a semiconductor device includes a first drain sub-string including a first drain select transistor, one or more memory cells and a first drain pass transistor, which are connected to each other in series, a second drain sub-string including a second drain select transistor, one or more memory cells and a second drain pass transistor, which are connected to each other in series, a first source sub-string including a first source select transistor, one or more memory cells and a first source pass transistor, which are connected to each other in series, a second source sub-string including a second source select transistor, one or more memory cells and a second source pass transistor, which are connected to each other in series, a bit line connected to one ends of the first and second drain sub-strings, and a source line connected to one ends of the first and second source sub-strings, wherein the other ends of the first and second drain sub-strings and the first and second source sub-strings are connected to each other.

In an exemplary embodiment of the present invention, a semiconductor device includes a plurality of semiconductor pillars arranged over a substrate, connection channels each connected to one ends of four semiconductor pillars arranged in a first direction, among the semiconductor pillars, a source line extending in a second direction crossing the first direction and connected to the other ends of first and second semiconductor pillars adjacent to each other among the four semiconductor pillars, a bit line extending in the first direction and connected to the other ends of the other semiconductor pillars among the four semiconductor pillars, stack structures formed between the source and bit lines and the substrate each including a pass word line, at least one word line and a select line which are stacked over the substrate and extend in the second direction, a memory layer interposed between the word line and each of the four semiconductor pillars; and a gate insulating layer interposed between the pass word line and each of the four semiconductor pillars and between the select line and each of the four semiconductor pillars.

DETAILED DESCRIPTION

Figure 1:
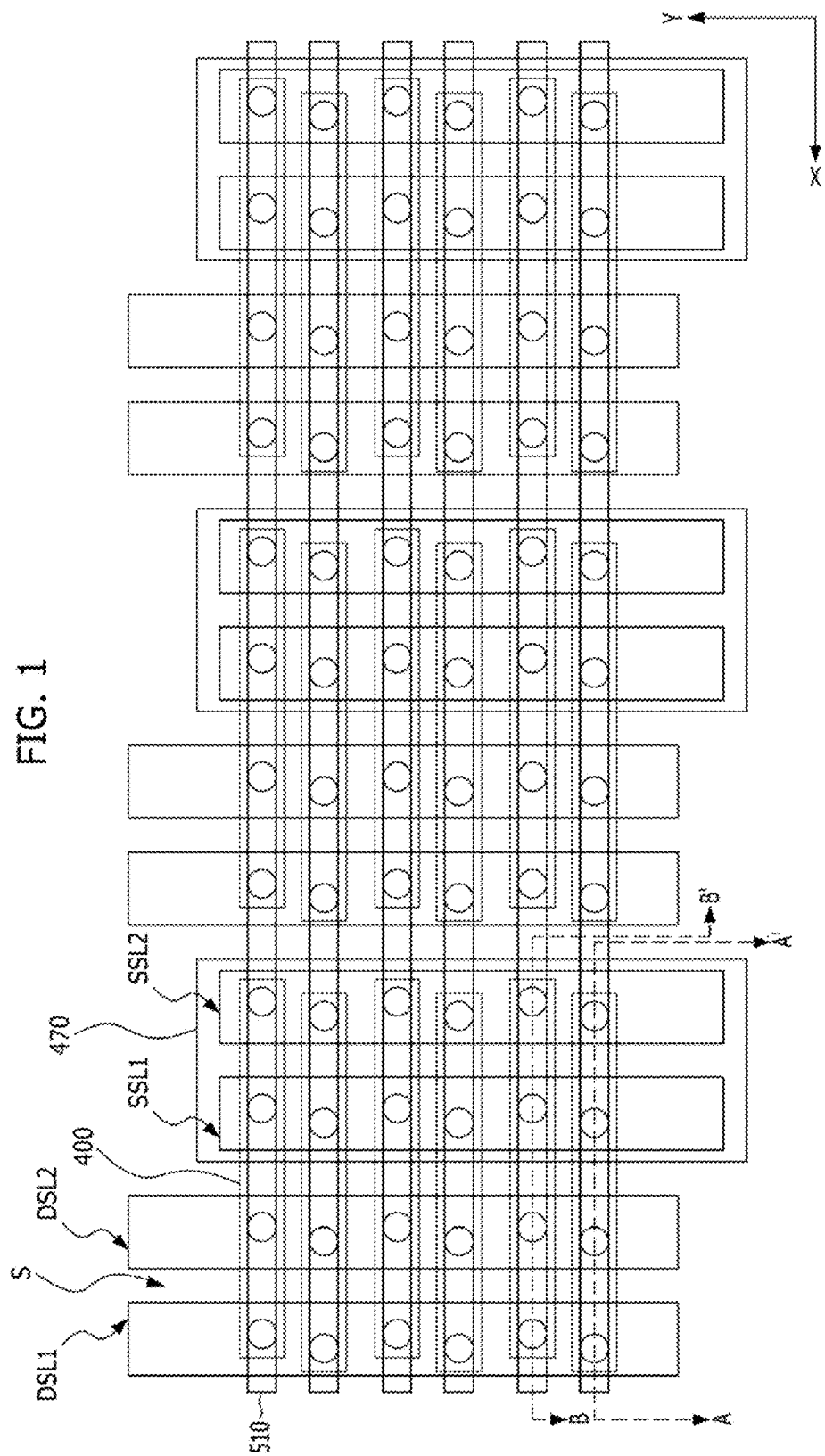
FIG. 1 is a top view illustrating a semiconductor device according to an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate. It is also noted that in this specification, "connected/coupled" refers to one component not only directly coupling another component but also indirectly coupling another component through an intermediate component. In addition, a singular form may include a plural form as long as it is not specifically mentioned in a sentence.

Hereinafter, a semiconductor device according to embodiments of the present invention will be described with reference to FIGS. 1 to 5.

Figure 2:
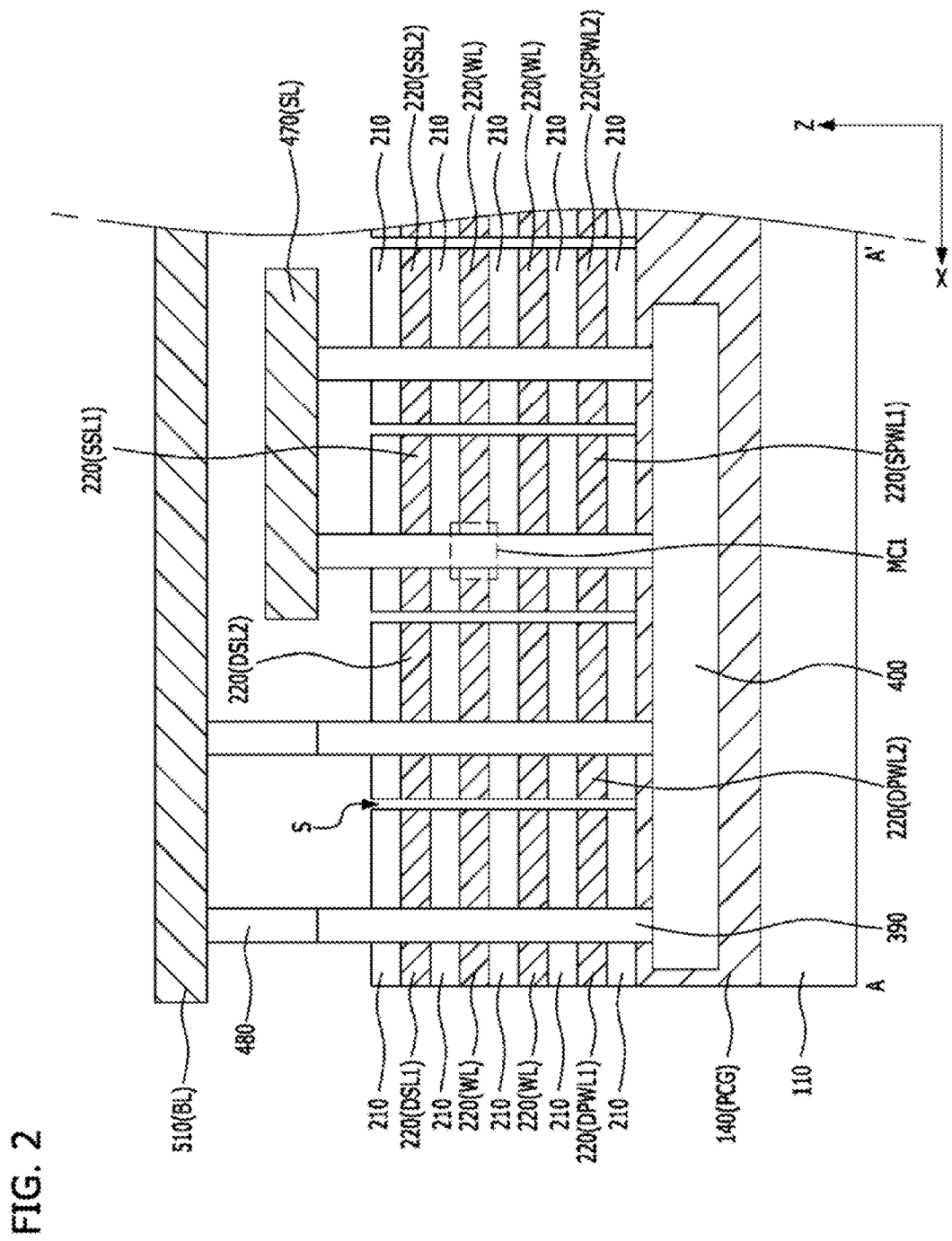
FIG. 2 is a cross-sectional view illustrating the semiconductor device taken along line A-A' of FIG. 1.
Figure 3:
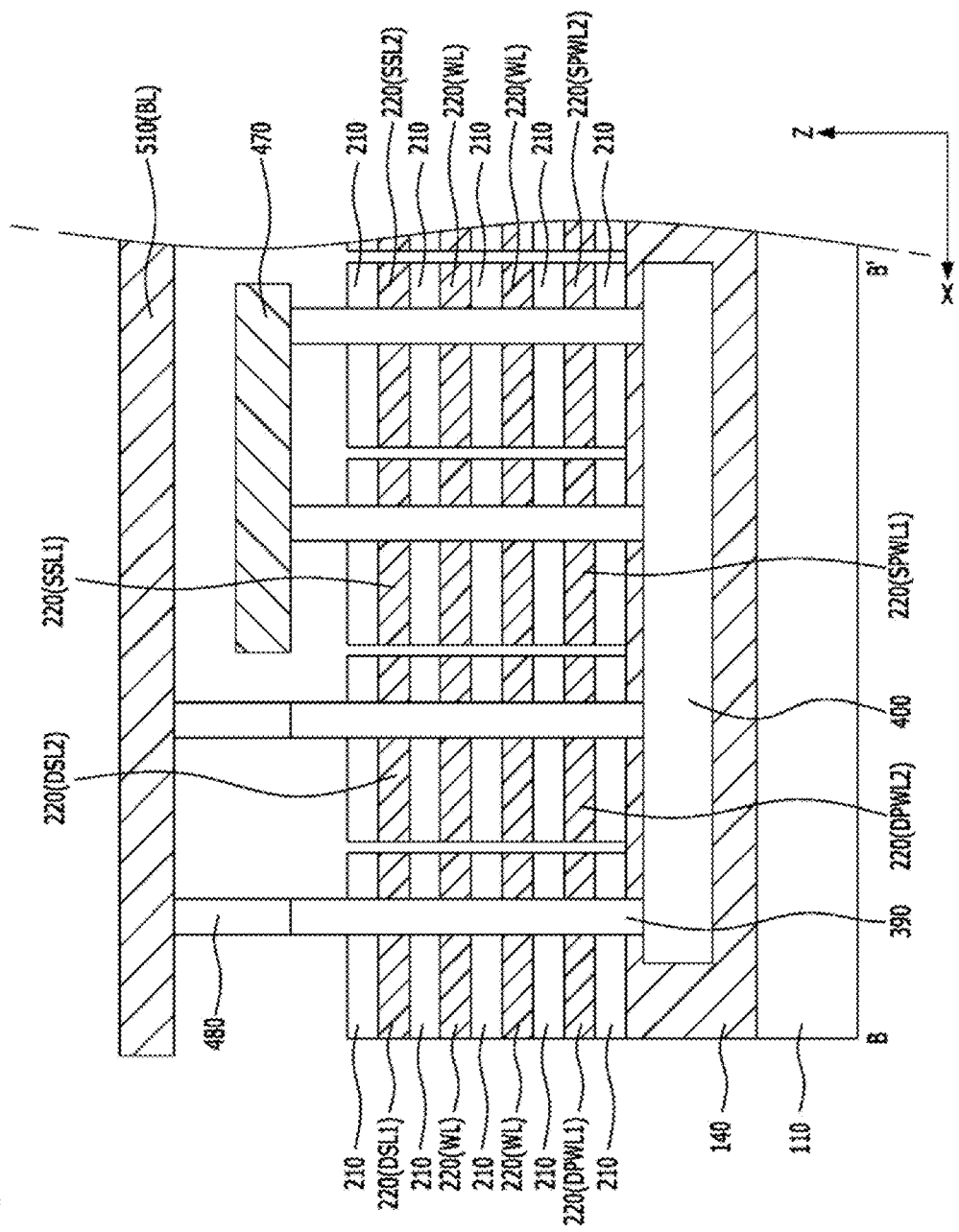
FIG. 3 is a cross-sectional view illustrating the semiconductor device taken along line B-B' of FIG. 1.
Figure 4:
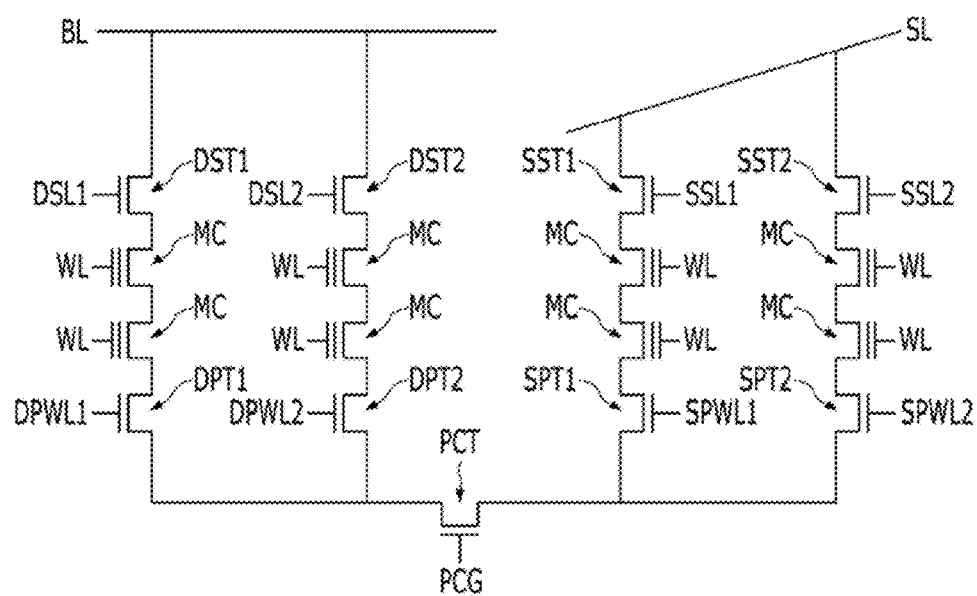
FIG. 4 is a circuit diagram illustrating the semiconductor device of FIG. 2 or 3.
Figure 5:
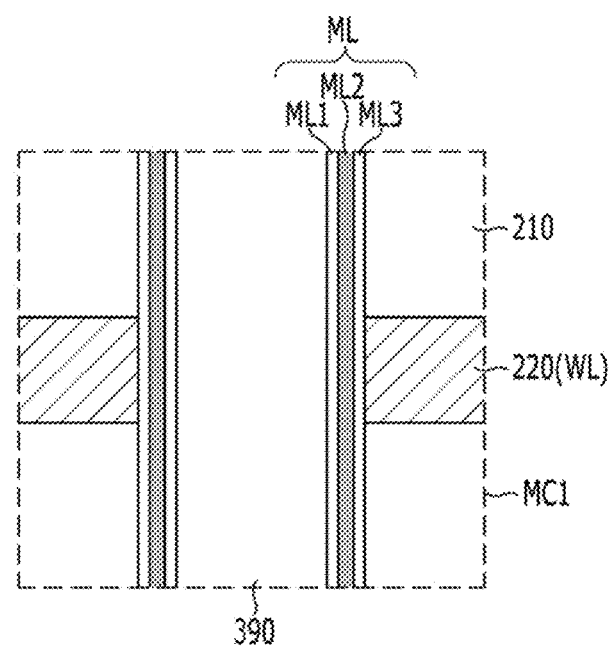
FIG. 5 is an enlarged view illustrating a memory cell shown in FIG. 2.

FIG. 1 is a top view illustrating a semiconductor device according to an embodiment of the present invention; FIG. 2 is a cross-sectional view taken along line A-A' of FIG. 1; FIG. 3 is a cross-sectional view taken along line B-B' of FIG. 1; FIG. 4 is a circuit diagram corresponding to FIG. 2 or 3; and FIG. 5 is an enlarged view of the memory cell illustrated in FIG. 2. Hereinafter, a semiconductor device according to an embodiment of the present invention will be described with reference to FIGS. 1 to 3 while referring to FIG. 4 and/or FIG. 5 as necessary. For ease of explanation, a direction which is parallel to the substrate and in which a word line, a drain select line, a source select line and/or a source line extends, will be referred to as "Y direction"; a direction which is parallel to the substrate and intersects the Y direction, will be referred to as "X direction"; and a direction perpendicular to the substrate will be referred to as "Z direction".

Referring to FIGS. 1 to 3, a substrate 110 is provided. The substrate 110 may be formed of various materials such as a semiconductor material and may include an insulating layer (not shown) at the uppermost portion thereof. The insulating layer may function to insulate the substrate 110 from a first conductive layer 140 or to insulate the substrate 110 from a connection channel 400 if the first conductive layer 140 is omitted.

The first conductive layer 140 having at least one connection channel 400 buried therein may be formed on the substrate 110. The first conductive layer 140 may have a flat plate shape and may be formed so as to surround the connection channel 400 excluding its portions coming into contact with semiconductor pillars 390. The first conductive layer 140 may be formed of a conductive material, for example, a metal, a metal nitride, an impurity-doped polysilicon or the like. A plurality of the connection channels 400 may be arranged in a matrix configuration along the X or Y direction and formed of a semiconductor material such as polysilicon, or a conductive material such as a metal, a metal nitride or an impurity-doped polysilicon. Between the first conductive layer 140 and the connection channel 400, a gate insulating layer (not shown) may be interposed. The gate insulating layer may be a single layer or multiple layers including an oxide layer, a nitride layer or the like and may also be formed of the same material as that of a memory layer to be described below.

The shape of the first conductive layer 140 is not limited to that shown in the figures, and it is sufficient if the first conductive layer 140 contacts at least a portion of the connection channel 400 with the gate insulating layer interposed therebetween. Furthermore, when the connection channel 400 is formed of a highly conductive material such as a metal or a metal nitride, the first conductive layer 140 may also be omitted. Even if the first conductive layer 140 is omitted, four semiconductor pillars 390 may be connected to each other by the connection channel 400. When the first conductive layer 140 is omitted, the space between the connection channels 400 may be filled with an insulating material (not shown).

One connection channel 400, a first conductive layer 140 adjacent thereto and a gate insulating layer interposed therebetween may constitute one pipe channel transistor (see PCT in FIG. 4). Since the first conductive layer 140 serves as a gate in the pipe channel transistor, it can also be referred to as a pipe channel gate (PCG). The connection channel 400 may function as the channel of the pipe channel transistor. The pipe channel transistor may function to control the connection of four semiconductor pillars 390 to one connection channel 400.

On the connection channel 400 and the first conductive layer 140 or on an insulating layer between the connection channels 400 if the first conductive layer 140 is omitted, a structure may be formed in which each of a plurality of interlayer insulating layers 210 and each of a plurality of second conductive layers 220 are alternately stacked on each other, hereinafter referred to as "stack structure". Furthermore, on the connection channel 400, a plurality of semiconductor pillars 390 may be formed which passes through the stack structures and/or the first conductive layer 140 to contact the connection channel 400. One connection channel 400 may contact with four semiconductor pillars 390 arranged along the X direction. That is, each connection channel 400 may contact four semiconductor pillars 390 to connect the pillars 390 to each other. When viewed from the top the connection channel 400 may have a bar shape having a long axis in the X direction and a short axis in the Y direction. The interlayer insulating layers 210 may be formed of various insulating materials such as oxides, nitrides or the like, and the second conductive layers 220 may be formed of a conductive material, for example, a metal, a metal nitride, an impurity-doped polysilicon or the like. The semiconductor pillars 390 may be formed of a semiconductor material such as polysilicon.

In the stack structures between the semiconductor pillars 390 arranged in the X direction, a slit S extending in the Y direction may be formed. Due to the slit S, each stack structure may be divided for each semiconductor pillar 390 in the X direction and extend in the Y direction. Hereinafter, for ease of explanation, four semiconductor pillars 390 connected to one connection channel 400 will be referred to as first to fourth semiconductor pillars, respectively, from one side, for example, the left side, and the stack structures that surround the first to fourth semiconductor pillars, respectively, will be referred to as first to fourth stack structures.

As an example the first and second semiconductor pillars are electrically connected to the bit line 510 to be described below, and the third and fourth semiconductor pillars are electrically connected to the source line 470 to be described below. In this instance, the lowest second conductive layers 220 in the first and second stack structures may function as first and second drain pass word lines DPWL1 and DPLW2, the uppermost second conductive layers 220 may function as first and second drain select lines DSL1 and DSL2, and the remaining second conductive layers 220 may function as word lines WL. Additionally, the lowest second conductive layers 220 in the third and fourth stack structures may function as first and second source pass word lines SPWL1 and SPLW2, the uppermost second conductive layers 220 may function as first and second source select lines SSL1 and SSL2, and the remaining second conductive layers 220 may function as word lines WL.

However, the position of the semiconductor pillars 390 that are connected with the bit lines 510 and the source lines 470 may be changed in various ways. Regardless of the order, two semiconductor pillars 390 adjacent to each other may be connected to the source line 470, and the remaining two semiconductor pillars may be connected to the bit line 510. The function of the second conductive layers 220 in the stack structures corresponding to the semiconductor pillars 390 may also be changed. For example, the first and second semiconductor pillars may be connected to the source line 470, and the third and fourth semiconductor pillars may be connected to the bit line 510, and thus the first and second stack structures may include the first and second source pass word lines SPWL1 and SPWL2 and the first and second source select lines SSL1 and SSL2, and the third and fourth stack structures may include the first and second drain pass word lines DPWL1 and DPLW2 and the first and second drain select lines DSL1 and DSL2. Alternatively, for example, the first and fourth semiconductor pillars may be connected to the bit line 510, and the second and third semiconductor pillars may be connected to the source line 470, and thus the second and third stack structures may include the first and second source pass word lines SPWL1 and SPWL2 and the first and second source select lines SSL1 and SSL2, and the first and fourth stack structures may include the first and second drain pass word lines DPWL1 and DPLW2 and the first and second drain select lines DSL1 and DSL2.

Between the second conductive layer 220 functioning as a word line WL and the semiconductor pillars 390, a memory layer (see ML in FIG. 5) capable of storing charges may be interposed. One semiconductor pillar 390, one word line WL adjacent thereto and a memory layer interposed therebetween may constitute one memory cell (see MC in FIG. 4). FIG. 5 is an enlarged view of any one of a plurality of memory cells, for example, the first memory cell MC1 shown in FIG. 2. Referring to FIG. 5, the memory layer ML may include a tunnel insulating layer ML1 that is disposed at the side of the semiconductor pillar 390 and enables charge tunneling, a charge blocking layer ML3 that is disposed at the side of the word line WL and blocks charge movement, and a charge storing layer ML2 that is interposed between the tunnel insulating layer ML1 and the charge blocking layer ML3 and functions to store charges. Herein, the tunnel insulating layer ML1 and the charge blocking layer ML3 may be, for example, oxide layers, and the charge storage layer ML2 may be, for example, a nitride layer or a polysilicon layer. As charges are stored in or discharged from the charge storage layer ML2, data '0' or '1' can be stored in the memory cell. FIG. 5 shows the memory layer ML surrounding the semiconductor pillar 390, but the scope of the present invention is not limited thereto, and it is sufficient if the memory layer ML is interposed between the word line WL and the semiconductor pillar 390.

Between the semiconductor pillar 390 and each of the first and second source pass word lines SPWL1 and SPWL2, the first and second source select lines SSL1 and SSL2, the first and second drain pass word lines DPWL1 and DPLW2, and the first and second drain select lines DSL1 and DSL2, a gate insulating layer (not shown) may be interposed. One semiconductor pillar 390, each of the first and second source pass word lines SPWL1 and SPWL2, the first and second source select lines SSL1 and SSL2, the first and second drain pass word lines DPWL1 and DPLW2, and the first and second drain select lines DSL1 and DSL2, which are adjacent to the semiconductor pillar 390, and a gate insulating layer interposed therebetween, may constitute first and second source pass transistors (see SPT1 and SPT2 in FIG. 4), first and second source select transistors (see SST1 and SST2 in FIG. 4), first and second drain pass transistors (see DPT1 and DPT2 in FIG. 4), and first and second drain select transistors (see DST1 and DST2 in FIG. 4).

As a result, a pass transistor, one or more memory cells and a select transistor, which are connected in series, may be formed along each of the semiconductor pillars, and this formed structure can be referred to as "sub-string". For example, the first drain pass transistor DTP1, the memory cell MC and the first drain select transistor DST1, which are connected in series, may form a first drain sub-string along the first semiconductor pillar; the second drain pass transistor DTP2, the memory cell MC and the second drain select transistor DST2, which are connected in series, may form a second drain sub-string along the second semiconductor pillar; the first source pass transistor SPT1, the memory cell MC and the first source select transistor SST1, which are connected in series, may form a first source sub-string along the third semiconductor pillar; and the second source pass transistor SPT2, the memory cell MC and the second source select transistor SST2, which are connected in series, may form a second source sub-string along the fourth semiconductor pillar. The first drain sub-string and any one of the first and second source sub-strings may be connected to each other by the connection channel 400 or the pipe channel transistor PCT to form a U-shaped first memory string, and the second drain sub-string and the other one of the first and second source sub-strings may be connected to each other by the connection channel 400 or the pipe channel transistor PCT to form a U-shaped second memory string. As a result, two memory strings may be formed using one connection channel 400.

The source line 470 may be electrically connected to the upper ends of two adjacent semiconductor pillars among the four semiconductor pillars 390 and may extend in the Y direction. In this embodiment, the source line 470 is connected to the third and fourth semiconductor pillars, but the scope of the present invention is not limited thereto, and the source line 470 may be connected to the first and second semiconductor pillars or to the second and third semiconductor pillars. The bit line 510 may be connected to the upper ends of the remaining two semiconductor pillars (e.g., the first and second semiconductor pillars) that are not connected to the source line 470, while it may extend in the X direction. Herein, the bit line 510 may be located above the source line 470, and in this case, the bit line 510 may be electrically connected to the semiconductor pillars 390 with a conductive contact 480 interposed therebetween. Alternatively, the source line 470 may be connected directly to the semiconductor pillars 390. Each of the bit line 510 and the source line 470 may be formed of a low-resistance material such as a metal.

To one source line 470, one end of each of the first and second memory strings may be connected, and to one bit line 510, the other end of each of the first and second memory strings may be connected. The plurality of first memory strings and the plurality of second memory strings, which are connected to one source line 470, may form one memory block. Specifically, FIG. 1 illustratively shows three memory blocks.

In this embodiment, the semiconductor pillars 390 may be arranged in the Y direction in a zigzag configuration rather than a linear configuration. For example, the semiconductor pillars 390 at the odd-number positions in the Y direction may be arranged to be inclined to the right side in the X direction from the central axis of the Y direction, and the semiconductor pillars 390 at the even-number positions in the Y direction may be arranged to be inclined to the left side in the X direction from the central axis of the Y direction. This arrangement is used to ensure the distance between the adjacent semiconductor pillars 390, thereby facilitating the fabrication process and ensuring memory cell characteristics. For this reason, the connection channels 400 at the odd-number positions in the Y direction may also be arranged to be inclined to the right side in the X direction from the central axis of the Y direction, and the connection channels 400 at the even-number positions in the Y direction may also be arranged to be inclined to the left side in the X direction from the central axis of the Y direction.

In the semiconductor device described above, two memory strings may be formed using one connection channel 400, and thus the size of the device may be reduced.

Furthermore, since the slits S are repeatedly formed at constant intervals in the stack structures composed of the interlayer insulating layers 210 and the second conductive layers 220, the process for fabricating the device is simple. Additionally, the X-direction width of the second conductive layers 220, particularly the word lines WL, may be made constant, and thus the uniformity of the memory cells may be ensured.

Moreover, since both the bit line 510 and the source line 470 are located above the memory cells, the bit line 510 and the source line 470 may be formed of a low-resistance conductive material.

Program/erase/read or verification operations in the semiconductor devices described above may be performed as follows. In such operational procedures, the pipe channel transistor PCT may be maintained in a turned-on state.

First, the erase operation will be described with reference to FIGS. 1 to 5 and Table 1 below. Table 1 below shows voltages that may be applied to lines during the erase operation.

TABLE 1

| BL | DSL1, 2 | DPWL1, 2 | SL | SSL1, 2 | SPWL1, 2 | WL |
|---|---|---|---|---|---|---|
| Floating or Vera | Floating | Floating | Floating or Vera | Floating | Floating | 0 V |

In the erase operation, an erase voltage Vera may be applied to at least one of the bit line BL and the source line SL. Specifically, the erase voltage Vera may be applied to both the bit line BL and the source line SL. Alternatively, the erase voltage Vera may be applied to the bit line BL, and the source line SL may be floated or the erase voltage Vera may be applied to the source line SL, and the bit line may be floated. The erase voltage Vera may be a positive high voltage, for example, about 20V. To the word line WL, a voltage sufficiently lower than the erase voltage Vera, for example, about 0V, may be applied. The remaining lines, that is, the first and second drain select lines DSL1 and DSL2, the first and second drain pass word lines DPWL1 and DPWL2, the first and second source select lines SSL1 and SSL2, and the first and second source pass word lines SPWL1 and SPWL2, may be floated. In this case, the erase voltage Vera applied to at least one of the bit line BL and the source line SL is transferred to the semiconductor pillars 390, and electrons stored in the memory cells MC are discharged to the semiconductor pillars 390 by a difference between the erase voltage Vera and the low voltage applied to the word line WL, whereby the data erase operation of the memory cells MC may be performed.

The program operation will now be described with reference to FIGS. 1 to 5 and Table 2 below. Table 2 below shows voltages that may be applied to lines during the program operation for a selected memory cell. Herein, it is described as an example that the selected memory cell is the first memory cell MC1 shown in FIG. 2.

The first memory cell MC1 may be included in the first memory string including the first drain sub-string and the first source sub-string. A bit line BL to which the first memory string including the first memory cell MC1 is connected will hereinafter be referred to as "selected bit line (sel. BL)", and the remaining bit line BL will now be referred to as "unse-lected bit line (unsel. BL)". Since the bit lines BL extend in the X direction, the second memory string, which does not include the first memory cell MC1 and shares the connection channel 400 with the first memory string, is also connected to the selected bit line (sel. BL). For example, the selected bit line (sel. BL) may be the bit line BL shown in FIG. 2, and the unselected bit line (unsel. BL) may be the bit line BL shown in FIG. 3. In addition, a word line WL connected to the first memory cell MC will be referred to as "selected word line (sel. WL)", and the remaining word line WL will be referred to as "unselected word line (unsel. WL)". The first drain select line DSL1, first drain pass word line DPWL1 and first source pass word line SPWL1 of the first memory string may be a selected drain select line (sel. DSL), a selected drain pass word line (sel. DPWL) and a selected source pass word line (sel. SPWL), respectively. Additionally, the second drain select line DSL2, second drain pass word line DPWL2 and second source pass word line SPWL2 of the second memory string may be an unselected drain select line (unsel. DSL), an unselected drain pass word line (unsel. DPWL) and an unselected source pass word line (unsel. SPWL), respectively.

To program the first memory cell MC1, a low voltage, for example, 0V, may be applied to the selected bit line (sel. BL). To turn on the first drain select transistor DST1, the first drain pass transistor DPT1, the first source pass transistor SPT1 and the memory cell transistors, a supply voltage Vcc and/or a pass voltage Vpass, for example, may be applied to the first drain select line DSL1, the first drain pass word line DPWL1, the first source pass word line SPWL1 and the unselected word line (unsel. WL). A positive high voltage that is a program voltage Vpgm, for example, about 20V, may be applied to the selected word line (sel. WL). The first source select line SSL1 may be applied with, for example, 0V, and the source line SL may be applied with, for example, a supply voltage Vcc, so that the current flow between the first memory string and the source line SL may be blocked. Electrons may be injected into the memory layer ML of the first memory cell MC1 by a difference between the program voltage Vpgm applied to the selected word line (sel. WL) and the low voltage that is transferred to the semiconductor pillars 390 through the selected bit line (sel. BL), whereby the first memory cell MC1 may be programmed.

To prevent the programming of the memory cells of the second memory string connected to the selected bit line (sel. BL), a voltage that turns off the second drain select transistor DST2, the second drain pass transistor DPT2, the second source pass transistor SPT2 and the second source select transistor SST2, for example, 0V, may be applied to the second drain select line DSL2, the second drain pass word line DPWL2, the second source pass word line SPWL2 and the second source select line SSL2, thereby preventing a voltage

TABLE 2

| sel.BL | unsel.BL | sel.DSL(DSL1) | unsel.DSL(DSL2) | SSL1, SSL2 |
|---|---|---|---|---|
| 0 V | Vcc | Vcc | 0 V | 0 V |
| sel.WL | unsel.WL | sel.DPWL(DPWL1) sel.SPWL(SPWL1) | unsel.DPWL(DPWL2) unsel.SPWL(SPWL2) | SL |
| Vpgm | Vpass | Vcc or Vpass | 0 V | Vcc | from being transferred from the selected bit line (sel. BL) to the semiconductor pillars 390. In addition, to prevent the programming of the memory strings connected to the unselected bit line (unsel. BL), a positive voltage for preventing programming, for example, a supply voltage Vcc, may be applied to the unselected bit line.

The read or verification operation will now be described with to reference to FIGS. 1 to 5 and Table 3 below. Table 3 below shows voltages that may be applied to lines during the read operation for the selected memory cell. As an example, the selected memory cell is the first memory cell MC1 shown in FIG. 2.

TABLE 3

| sel.BL | unsel.BL | sel.DSL(DSL1) | unsel.DSL(DSL2) | SSL1, SSL2 |
|---|---|---|---|---|
| 1 V | 0 V | Vcc | 0 V | Vcc |
| sel.WL | unsel.WL | sel.DPWL(DPWL1) | unsel.DPWL(DPWL2) | SL |
| | | sel.SPWL(SPWL1) | unsel.SPWL(SPWL2) | |
| Vread | Vpass | Vpass or Vcc | 0 V | 0 V |

To read the first memory cell MC1, a specific voltage that may pre-charge the selected bit line (sel. BL), for example, about 1V, may be applied thereto. To turn on the first drain select transistor DST1, the first drain pass transistor DPT1, the first source pass transistor SPT1, the first source select transistor SST1 and the memory cell transistors, a supply voltage Vcc and/or a pass voltage Vpass, for example, may be applied to the first drain select line DSL1, the first drain pass word line DPWL1, the first source pass word line SPWL1, the first source select line SSL1 and the unselected word line (unsel. WL). In addition, a read voltage Vread may be applied to the selected word line (sel. WL), and 0V may be applied to the source line SL. Data stored in the first memory cell MC1 may be read by sensing whether the voltage level of the selected bit line (sel. BL) changes.

To prevent the reading of the memory cells of the second memory string connected to the selected bit line (sel. BL), a voltage that turns off the second drain select transistor DST2, the second drain pass transistor DPT2 and the second source pass transistor SPT2, for example, 0V, may be applied to the second drain select line DSL2, the second drain pass word line DPWL2 and the second source pass word line SPWL2, thereby blocking current flow from the selected bit line (sel. BL). Although 0V may be applied to the second source select line SSL2, the same voltage as that applied to the first source select line SSL1, for example, a supply voltage Vcc, may also be applied to the second source select line SSL2. Additionally, to prevent the reading of the memory strings connected to the unselected bit line (unsel. BL), the unselected bit line may be maintained at 0V.

In the operating method described above, even when the first and second memory strings are connected to the same bit line BL and the same source line SL, only the memory cell included in any one of the memory strings may be selectively programmed/read by controlling voltages that are applied to the first and second drain pass word lines DPWL1 and DPWL2, the first and second drain select lines DSL1 and DSL2, the first and second source pass word lines SPWL1 and SPWL2, and the first and second source select lines SSL1 and SSL2. The first drain pass word line DPWL1 and the first source pass word line SPWL1 may be applied with the same voltage as that applied to the first drain select line DSL1 corresponding thereto, and the second drain pass word line DPWL2 and the second source pass word line SPWL2 may be applied with the same voltage as that applied to the second drain select line DSL2 corresponding thereto.

In addition, in each of the above-described operations, the same voltage may be applied to the first and second source select lines SSL1 and SSL2. Thus, although the first and second source select lines SSL1 and SSL2 separated from each other by the slit S are described in the above embodiments, the first and second source select lines SSL1 and SSL2 may not be separated from each other. That is, the first and second source select lines SSL1 and SSL2 may be a single line having a shape similar to that of the source line SL.

According to the semiconductor device of the embodiments of the present invention, the uniformity of the memory cells may be ensured, the size of the device may be reduced, and the process for fabricating the device may be simplified.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
    four semiconductor pillars extending in a direction perpendicular to a substrate;
    a connection channel formed on the substrate and connected to one ends of the four semiconductor pillars;
    a source line connected to the other ends of first and second semiconductor pillars adjacent to each other among the four semiconductor pillars;
    a bit line connected to the other ends of third and fourth semiconductor pillars among the four semiconductor pillars;
    first to fourth stack structures, which are formed along the first to fourth semiconductor pillars, respectively, between the source and bit lines and the substrate and each includes a pass word line, at least one word line and a select line which are stacked over the substrate;
    a memory layer interposed between the word line and each of the first to fourth semiconductor pillars; and
    a gate insulating layer interposed between the pass word line and each of the first to fourth semiconductor pillars and between the select line and each of the first to fourth semiconductor pillars.

2. The semiconductor device of claim 1, wherein the memory layer comprises a tunnel insulating layer, a charge storing layer and a charge blocking layer.

3. The semiconductor device of claim 2, wherein the gate insulating layer is formed of the same material as that of the memory layer.

4. The semiconductor device of claim 1, further comprising:
    a conductive layer formed in contact with the connection channel with a gate insulating layer interposed therebetween.

5. The semiconductor device of claim 1, wherein the first to fourth stack structures are separated from each other by a slit.

6. The semiconductor device of claim 1, wherein the first to fourth stack structures are separated from each other by a slit, except for select lines of the first and second stack structures, and the select lines are connected to each other.

7. The semiconductor device of claim 1, wherein the word line included in each of the first to fourth stack structures has a constant width.

8. The semiconductor device of claim 1, wherein the first semiconductor pillar and stack structure and the third semiconductor pillar and stack structure form a first memory string, and the second semiconductor pillar and stack structure and the fourth semiconductor pillar and stack structure form a second memory string.

9. The semiconductor device of claim 8, wherein the semiconductor pillars form pass transistors and select transistors with the pass word line and the select line, respectively, and with the gate insulating layer interposed therebetween, and the semiconductor pillars form memory cells with the word line and the memory layer interposed therebetween.

10. The semiconductor device of claim 9, wherein, during a program or read operation for a selected memory cell included in the first memory string, a select line of the third stack structure and pass word lines of the first and third stack structures are supplied with voltages to turn on select transistors and pass transistors, and a select line of the fourth stack structure and pass word lines of the second and fourth stack structures are supplied with voltages to turn off select transistors and pass transistors.

11. The semiconductor device of claim 10, wherein, during the program or read operation, the same voltage is applied to the select lines of the first and second stack structures.

12. A semiconductor device comprising:
a first drain sub-string including a first drain select transistor, one or more memory cells and a first drain pass transistor, which are connected to each other in series;
a second drain sub-string including a second drain select transistor, one or more memory cells and a second drain pass transistor, which are connected to each other in series;
a first source sub-string including a first source select transistor, one or more memory cells and a first source pass transistor, which are connected to each other in series;
a second source sub-string including a second source select transistor, one or more memory cells and a second source pass transistor, which are connected to each other in series;
a bit line connected to one ends of the first and second drain sub-strings; and
a source line connected to one ends of the first and second source sub-strings,
wherein the other ends of the first and second drain sub-strings and the first and second source sub-strings are connected to each other.

13. The semiconductor device of claim 12, wherein a gate of the first source select transistor and a gate of the second source select transistor are connected to each other.

14. The semiconductor device of claim 12, wherein the first drain sub-string and the first source sub-string constitute a first memory string, and the second drain sub-string and the second source sub-string constitute a second memory string.

15. The semiconductor device of claim 14, wherein, during a program or read operation for a selected memory cell among memory cells included in the first memory string, the first drain select transistor, the first drain pass transistor and the first source pass transistor are turned on, and the second drain select transistor, the second drain pass transistor and the second source pass transistor are turned off.

16. The semiconductor device of claim 15, wherein, during the program or read operation, the first and second source select transistor are controlled together.

17. A semiconductor device comprising:
a plurality of semiconductor pillars arranged over a substrate;
connection channels each connected to one ends of four semiconductor pillars arranged in a first direction, among the semiconductor pillars;
a source line extending in a second direction crossing the first direction and connected to the other ends of first and second semiconductor pillars adjacent to each other among the four semiconductor pillars;
a bit line extending in the first direction and connected to the other ends of the other semiconductor pillars among the four semiconductor pillars;
stack structures formed between the source and bit lines and the substrate and each including a pass word line, at least one word line and a select line which are stacked over the substrate and extend in the second direction;
a memory layer interposed between the word line and each of the four semiconductor pillars; and
a gate insulating layer interposed between the pass word line and each of the four semiconductor pillars and between the select line and each of the four semiconductor pillars.

18. The semiconductor device of claim 17, further comprising:
a conductive layer formed in contact with the plurality of connection channels with a gate insulating layer interposed therebetween.

* * * * *